United States Patent
Geraghty et al.

(10) Patent No.: US 10,605,883 B2
(45) Date of Patent: Mar. 31, 2020

(54) SYSTEM AND METHOD FOR PRODUCING DISTORTION FREE MAGNETIC RESONANCE IMAGES USING DUAL-ECHO ECHO-PLANAR IMAGING

(71) Applicant: Sunnybrook Research Institute

(72) Inventors: Benjamin J. Geraghty, Toronto (CA); Charles H. Cunningham, Toronto (CA)

(73) Assignee: Sunnybrook Research Institute, Toronto (CA)

( * ) Notice: Subject to any disclaimer, the term of this patent is extended or adjusted under 35 U.S.C. 154(b) by 215 days.

(21) Appl. No.: 15/495,256

(22) Filed: Apr. 24, 2017

(65) Prior Publication Data

US 2017/0307717 A1 Oct. 26, 2017

Related U.S. Application Data

(60) Provisional application No. 62/326,314, filed on Apr. 22, 2016.

(51) Int. Cl.
*G01R 33/565* (2006.01)
*G01R 33/561* (2006.01)
(Continued)

(52) U.S. Cl.
CPC ..... *G01R 33/56554* (2013.01); *G01R 33/443* (2013.01); *G01R 33/4828* (2013.01); *G01R 33/5608* (2013.01); *G01R 33/5616* (2013.01)

(58) Field of Classification Search
CPC ............ G01R 33/56554; G01R 33/443; G01R 33/5616; G01R 33/5608; G01R 33/4828
See application file for complete search history.

(56) References Cited

U.S. PATENT DOCUMENTS

| 4,683,431 A | * | 7/1987 | Pattany | G01F 1/716 324/306 |
| 4,720,679 A | * | 1/1988 | Patrick | G01R 33/24 324/309 |

(Continued)

OTHER PUBLICATIONS

Albers MJ, et al. Hyperpolarized 13C lactate, pyruvate, and alanine: noninvasive biomarkers for prostate cancer detection and grading. Cancer Res 2008;68(20):8607-8615.

(Continued)

*Primary Examiner* — Dixomara Vargas
(74) *Attorney, Agent, or Firm* — Quarles & Brady LLP

(57) ABSTRACT

Described here are systems and methods for correcting magnetic resonance data for off-resonance effects arising from the use of a multi-echo echo planar imaging ("EPI") pulse sequence. Reference data are acquired, from which phase maps are computed in a distorted coordinate space associated with geometric distortions associated with the multi-echo EPI acquisition. Images reconstructed from the magnetic resonance data are demodulated using the distorted phase maps to produce distortion free images of the subject. Advantageously, the systems and methods can be used to reconstruct distortion free images from magnetic resonance data that is otherwise prone to image distortions from off-resonance errors, including data acquired from hyperpolarized nuclear spin species such as hyperpolarized carbon-13.

20 Claims, 9 Drawing Sheets

(51) Int. Cl.
G01R 33/44 (2006.01)
G01R 33/56 (2006.01)
G01R 33/48 (2006.01)

(56) References Cited

U.S. PATENT DOCUMENTS

| | | | | |
|---|---|---|---|---|
| 7,154,269 | B1* | 12/2006 | Haacke | G01R 33/56554 324/309 |
| 8,890,525 | B2* | 11/2014 | Kusahara | G01R 33/56554 324/309 |
| 9,581,671 | B2* | 2/2017 | Dannels | G01R 33/56554 |
| 2011/0260726 | A1* | 10/2011 | Techavipoo | G01R 33/246 324/309 |
| 2012/0146640 | A1* | 6/2012 | Kusahara | G01R 33/5616 324/309 |
| 2014/0266195 | A1* | 9/2014 | Levin | G01R 33/56509 324/309 |
| 2014/0361770 | A1* | 12/2014 | Dannels | G01R 33/5611 324/309 |
| 2015/0131884 | A1* | 5/2015 | Kimura | A61B 5/055 382/131 |
| 2015/0241537 | A1* | 8/2015 | Dannels | G01R 33/56554 324/309 |
| 2016/0097831 | A1* | 4/2016 | Dannels | G01R 33/5611 324/318 |
| 2018/0017652 | A1* | 1/2018 | Ye | G01R 33/5608 |
| 2018/0231631 | A1* | 8/2018 | Ye | G01R 33/5608 |

OTHER PUBLICATIONS

Ardenkjaer-Larsen JH, et al. Increase in signal-to-noise ratio of >10,000 times in liquid-state NMR. Proc Natl Acad Sci USA 2003;100(18):10158-10163.
Ardenkjaer-Larsen JH, et al. Dynamic nuclear polarization polarizer for sterile use intent. NMR Biomed 2011;24(8):927-932.
Chen AP, et al. Hyperpolarized C-13 spectroscopic imaging of the TRAMP mouse at 3T-initial experience. Magn Reson Med 2007;58(6):1099-1106.
Chen Nk, et al. Correction for epi distortions using multi-echo gradient echo imaging. Magnetic resonance in medicine 1999;41(6):1206-1213.
Cunningham CH, et al. Pulse sequence for dynamic volumetric imaging of hyperpolarized metabolic products. J Magn Reson 2008;193(1):139-146.
Cunningham CH, et al. Frequency correction method for improved spatial correlation of hyperpolarized 13C metabolites and anatomy. NMR Biomed 2014;27(2):212-218.
Day SE, et al. Detecting tumor response to treatment using hyperpolarized 13c magnetic resonance imaging and spectroscopy. Nature medicine 2007; 13(11):1382-1387.
Doherty JR, et al. Targeting lactate metabolism for cancer therapeutics. The Journal of clinical investigation 2013;123(9):3685-3692.
Durst M, et al. Comparison of acquisition schemes for hyperpolarised C imaging. NMR Biomed 2015;28(6):715-725.
Golman K, et al. Cardiac metabolism measured noninvasively by hyperpolarized 13C MRI. Magn Reson Med 2008;59(5):1005-1013.
Golman K, et al. Real-time metabolic imaging. Proceedings of the National Academy of Sciences 2006;103(30):11270-11275.
Golman K, et al. Metabolic imaging by hyperpolarized 13C magnetic resonance imaging for in vivo tumor diagnosis. Cancer Res 2006;66(22):10855-10860.
Gordon JW, et al. Development of a symmetric echo planar imaging framework for clinical translation of rapid dynamic hyperpolarized 13c imaging. Magnetic resonance in medicine 2016;.
Hirschhaeuser F, et al. Lactate: a metabolic key player in cancer. Cancer research 2011;71(22):6921-6925.
Jezzard P, et al. Correction for geometric distortion in echo planar images from b0 field variations. Magnetic resonance in medicine 1995;34(1):65-73.
Jezzard P, et al. Sources of distortion in functional mri data. Human brain mapping 1999;8(2-3):80-85.
Lau AZ, et al. Spectral-spatial excitation for rapid imaging of DNP compounds. NMR Biomed 2011;24(8):988-996.
Lau JY, et al. Voxel-by-voxel correlations of perfusion, substrate, and metabolite signals in dynamic hyperpolarized 13c imaging. NMR in Biomedicine 2016;29(8):1038-1047.
Miller JJ, et al. Robust and high resolution hyperpolarized metabolic imaging of the rat heart at 7 t with 3d spectral-spatial epi. Magnetic resonance in medicine 2015;.
Poser BA, et al. Single-shot echo-planar imaging with nyquist ghost compensation: Interleaved dual echo with acceleration (idea) echo planar imaging (epi). Magnetic resonance in medicine 2013;69(1):37-47.
Schmithorst VJ, et al. Simultaneous correction of ghost and geometric distortion artifacts in epi using a multiecho reference scan. IEEE transactions on medical imaging 2001;20(6):535-539.
Schroeder MA, et al. Hyperpolarized magnetic resonance: a novel technique for the in vivo assessment of cardiovascular disease. Circulation 2011; 124(14):1580-1594.
Schroeder MA, et al. Hyperpolarized 13C magnetic resonance reveals early-and late onset changes to in vivo pyruvate metabolism in the failing heart. European journal of heart failure 2013;15(2):130-140.
Tsai CM, et al. Reduced aliasing artifacts using variable-density k-space sampling trajectories. Magn Reson Med 2000;43(3):452-458.
Visser E, et al. Reference-free unwarping of epi data using dynamic off-resonance correction with multiecho acquisition (docma). Magnetic resonance in medicine 2012;68(4):1247-1254.
Yang QX, et al. Double-sampled echo-planar imaging at 3 tesla. Journal of Magnetic Resonance, Series B 1996;113(2):145-150.
Yen YF, et al. Imaging considerations for in vivo 13C metabolic mapping using hyperpolarized 13C-pyruvate. Magn Reson Med 2009;62(1):1-10.

* cited by examiner

SYSTEM AND METHOD FOR PRODUCING DISTORTION FREE MAGNETIC RESONANCE IMAGES USING DUAL-ECHO ECHO-PLANAR IMAGING

CROSS-REFERENCE TO RELATED APPLICATIONS

This application claims the benefit of U.S. Provisional Patent Application Ser. No. 62/326,314, filed on Apr. 22, 2016, and entitled "SYSTEM AND METHOD FOR PRODUCING DISTORTION FREE MAGNETIC RESONANCE IMAGES USING DUAL-ECHO ECHO-PLANAR IMAGING."

BACKGROUND OF THE INVENTION

Hyperpolarized carbon-13 magnetic resonance imaging ("MRI") is an emerging technology, which seeks to enhance the existing capabilities of modern diagnostic MRI, with the capacity to monitor and visualize cellular metabolism in patients. The technique holds promise for probing pathological metabolism associated with various disease states including cancer and heart failure. A powerful feature of hyperpolarized carbon-13 MRI is the implicit registration of patient data obtained from conventional proton MRI and metabolic hyperpolarized carbon-13 exams, enabling multimodal data fusion.

Because the hyperpolarized state is short lived, rapid acquisition schemes are necessary to permit both time-resolved and volumetric imaging. For hyperpolarized substrates, such as [1-$^{13}$C]pyruvate, which give rise to sparse metabolic spectra, frequency-selective acquisition schemes can be leveraged to avoid the need for direct chemical shift encoding by resolving individual metabolite signals "up front" with spectral-spatial RF pulses. Once a single resonance has been excited, single-shot spatial encoding techniques can be employed to generate a 2D image within one repetition time ("TR"). When gating is unnecessary, echo-planar imaging offers benefits over spiral imaging due to its simpler image reconstruction and robustness to gradient delays.

In contrast to spectroscopic techniques, which directly encode both spatial and spectral content, echo-planar spatial encoding is very sensitive to variations in the local resonance frequency. Off-resonance magnetization can give rise to pixel shift artifacts along the blip encoding direction because of linear phase ramps in k-space that are caused by the off-resonance sources.

Static $B_0$ field mapping methods represent the gold standard approach for correcting EPI distortion in conventional proton MRI; however, the true off-resonance map for hyperpolarized carbon-13 signals is unavailable before the hyperpolarized carbon-13 injection, and performing a field mapping acquisition wastes precious, non-renewable magnetization. Inhomogeneities induce distortion in the metabolic maps, compromising the implicit spatial registration with respect to the underlying anatomy.

Thus, there remains a need to provide a method for producing distortion free images from hyperpolarized carbon-13 acquisitions without the need for time consuming field mapping acquisitions that waste non-renewable magnetization. Such methods should advantageously be applicable to other imaging applications, including diffusion imaging and other time-resolved or volumetric imaging techniques.

SUMMARY OF THE DISCLOSURE

The present disclosure addresses the aforementioned drawbacks by providing a method for producing distortion-free images using a magnetic resonance imaging ("MRI") system. Multi-echo data acquired from a subject using an MRI system operating a multi-echo echo planar imaging (EPI) pulse sequence are provided to a computer system. The multi-echo data are acquired from a first nuclear spin species. Reference multi-echo data acquired from the subject using the MRI system operating a multi-echo EPI pulse sequence are also provided to the computer system. The reference multi-echo data are acquired from a second nuclear spin species. Distorted phase maps are computed from the reference multi-echo data using the computer system. The distorted phase maps indicate a distorted coordinate space that represents geometric distortions arising from the multi-echo EPI pulse sequence. A first image is reconstructed from multi-echo data acquired at a first echo time and a second image is reconstructed from multi-echo data acquired at a second echo time in the multi-echo EPI pulse sequence. Undistorted first and second images are then generated by demodulating the first and second images using the distorted phase maps. An undistorted image of the subject is then produced by combining the undistorted first and second images.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION

Figure 1:
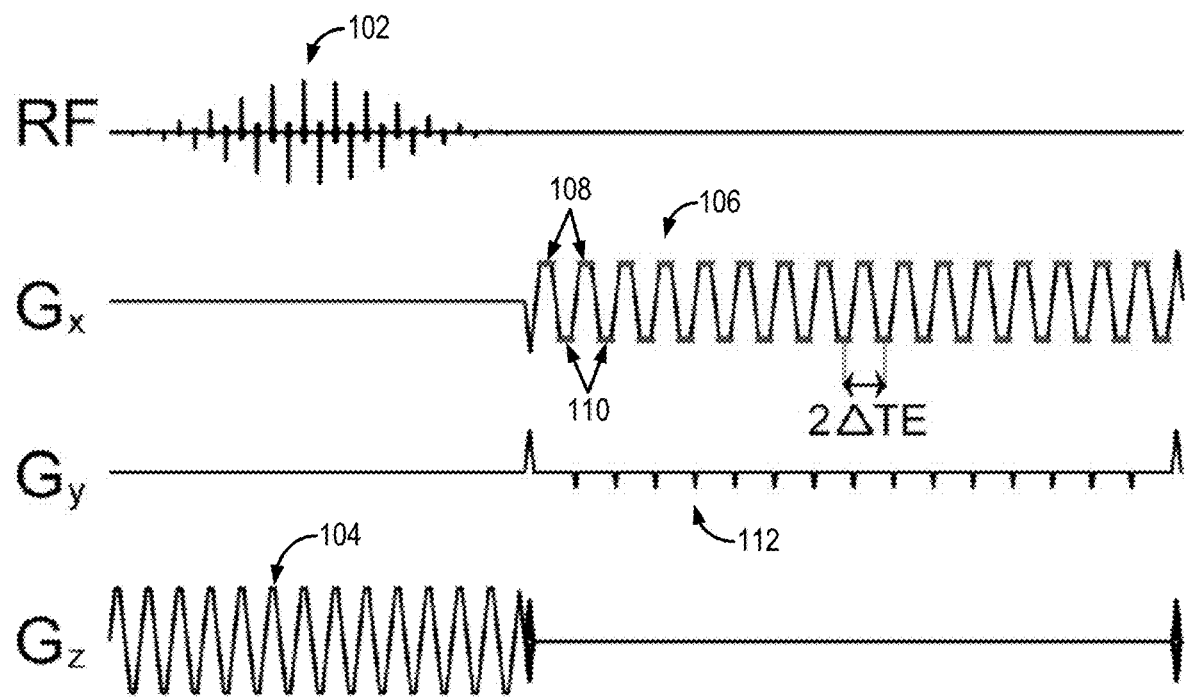
FIG. 1 shows an example dual-echo EPI pulse sequence diagram.

Described here are systems and methods for correcting magnetic resonance data for off-resonance effects using a field map that is encoded directly from the magnetic resonance data. The systems and methods described here implement a dual-echo, echo-planar imaging ("EPI") pulse sequence and a non-iterative reconstruction that is capable of encoding the field map directly from the acquired magnetic resonance signals. Advantageously, the systems and methods can be used to reconstruct corrected images from magnetic resonance data that is otherwise prone to image distortions from off-resonance errors.

As one example, the data can be data acquired from hyperpolarized carbon-13 using an EPI pulse sequence. Using conventional single echo EPI sequences, these data are prone to distortion that causes misregistration between the metabolic images and conventional anatomical magnetic resonance images. The acquisition and reconstruction schemes described in the present disclosure, however, ensure accurate spatial registration without loss in signal-to-noise ratio ("SNR") efficiency, and make frequency-selective EPI more robust to $B_0$ inhomogeneities. The systems and methods described here can be used in applications other than hyperpolarized carbon-13 imaging, including echo-planar diffusion tensor imaging and echo-planar functional MRI.

As mentioned above, the dual-echo EPI pulse sequence described in the present disclosure can be used to provide a built-in correction for off-resonance in time-resolved MRI applications, including time-resolved volumetric hyperpolarized carbon-13 metabolic mapping with [1-$^{13}$C]pyruvate or other spectrally sparse carbon-13 labeled metabolites. In general, the pulse sequence encodes additional information that can be utilized for correcting image distortions.

The phase evolution between the two echoes in the dual-echo sequence can be used to correct EPI distortions and improve spatial registration with the underlying anatomy. A correction term can be also obtained from a fully phase-encoded dual-echo EPI proton reference scan to account for asymmetry between odd and even echoes in the phase maps.

The "single-shot" capability afforded by conventional EPI sequences is achieved by rastering though k-space with a bipolar readout gradient train to encode one spatial dimension, and a series of blip gradients to encode the other. The result is that the effective readout bandwidth with respect to the blipped direction is typically orders of magnitude smaller than the large readout bandwidth used. Accordingly, the susceptibility of EPI acquisitions to off-resonance magnetization can be well approximated by considering only the bandwidth per pixel in the blip direction:

$$y' = y \pm \frac{\Delta f(y)}{BW_{pp}}; \tag{1}$$

where y is the pixel location in undistorted coordinates; $\Delta f(y)$ is the resonance frequency at location y; $BW_{pp}$ is the bandwidth per pixel in the blipped direction; and y' is the resulting pixel location in distorted coordinates. The sign of the $\Delta f(y)/BW_{pp}$ term in Eqn. (1) depends on the polarity of the blip gradient used.

The gold standard approach for correcting EPI distortion is to acquire a static $B_0$ map to measure $\Delta f(y)$, and then to apply Eqn. (1) to unwarp the image into undistorted coordinates.

Within the frequency-selective hyperpolarized carbon-13 imaging regime, however, the lack of prior knowledge of the true in vivo carbon-13 center frequency implies that a proton field map derived estimate of $\Delta f(y)$ cannot fully account for the observed distortion, as will be described in more detail below.

As mentioned above, the systems and methods described in the present disclosure implement a dual-echo EPI acquisition that encodes the resonance frequency, $\Delta f(y')$, in offset or distorted coordinates, y', directly from the data acquired with that dual-echo sequence. In one example, the data can be hyperpolarized carbon-13 data. Ignoring potential sources of odd and even readout asymmetry, $\Delta f(y')$ can be estimated as, $$\Delta f(y') = \angle \left\{ \frac{I(y')_{echo\ \#2}}{I(y')_{echo\ \#1}} \right\} \cdot (2\pi \Delta TE)^{-1}; \tag{2}$$

where $\angle \{I(y')_{echo\ \#2}/I(y')_{echo\ \#1}\}$ is the angle of the complex quotient of the dual-echo EPI images, $I(y')_{echo\ \#1}$ and $I(y')_{echo\ \#2}$ in distorted coordinates, and $\Delta TE$ is the echo-time difference between the first and second echo. Because the dual-echo field map and the EPI images are both measured in distorted coordinates, distortion correction can be applied by generating a pixel shift map, $$\Delta y(y') = \frac{\Delta f(y')}{BW_{pp}}; \tag{3}$$

and resampling the distorted image onto the undistorted coordinate space. An example data acquisition and image reconstruction pipeline is described below.

Figure 2:
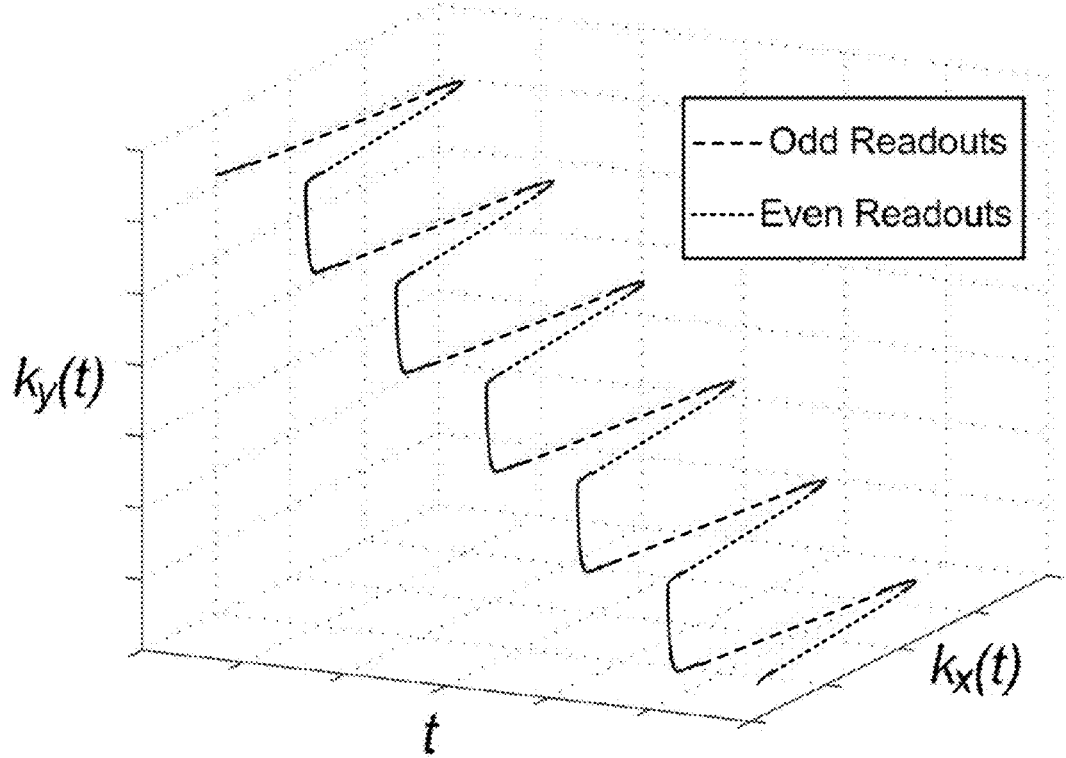
FIG. 2 shows a k-space trajectory traversed by the dual-echo EPI pulse sequence of FIG. 1. As one example, odd and even echoes can be separated by $\Delta TE=0.892$ ms, allowing for the extraction of field-map information from the phase difference between the odd and even readouts.

FIG. 1 is an example of a dual-echo EPI pulse sequence that can be implemented in some embodiments of the present invention, and FIG. 2 is an example of the k-space trajectory that is traversed by the pulse sequence of FIG. 1. The pulse sequence includes a radio frequency ("RF") excitation 102. The RF excitation 102 may be a spatially selective excitation, a spectrally selective excitation, or a spectral-spatial excitation. In the example shown in FIG. 1, a spectral-spatial RF pulse is shown. To this end, the pulse sequence may include a spatially selective gradient 104 played out during the RF excitation 102. As an example, the spatially selective gradient 104 can be a slice-select gradient.

Data acquisition is implemented using a readout gradient 106. As one non-limiting example, the readout gradient 106 can be a symmetric EPI readout gradient that includes a number of odd gradient lobes 108 and even gradient lobes 110. Data acquisition can occur during the plateaus of the gradient lobes 108, 110; however, in some embodiments data acquisition may also be implemented during the ramp portions of the gradient lobes 108, 110. Odd gradient echoes are sampled during the odd gradient lobes 108, and even gradient echoes are sampled during the even gradient lobes 110. Blip gradients 112 are applied along a phase-encoding direction to provide spatial encoding along that direction.

The dual-echo field map, $\Delta f(y')$, defined in Eqn. (2) assumes perfect echo symmetry. In practice, however, images derived from odd and even gradient echoes can differ in phase, mainly due to eddy currents induced by the large bipolar readout gradients. Therefore, the phase difference resulting from the complex quotient of the two echo images contains terms for the contribution from the local resonance frequencies, the parameter of interest, and a phase difference arising from echo asymmetry. If not accounted for, the echo asymmetry term can result in an erroneous offset in the distortion-corrected image, preventing accurate registration of the images-of-interest (e.g., hyperpolarized carbon-13 images) and the underlying anatomy.

A fully phase-encoded reference scan can be used to measure the echo asymmetry between the echoes from the positive and negative readout gradient lobes used in the dual-echo EPI readout. This asymmetry results in differences in the timing of echo formation relative to the center of each gradient lobe, as well as differences in echo phase that are due to transient offsets to the main magnetic field, (i.e., $B_0$ eddy currents), and which differ between positive and negative gradient lobes.

Figure 3:
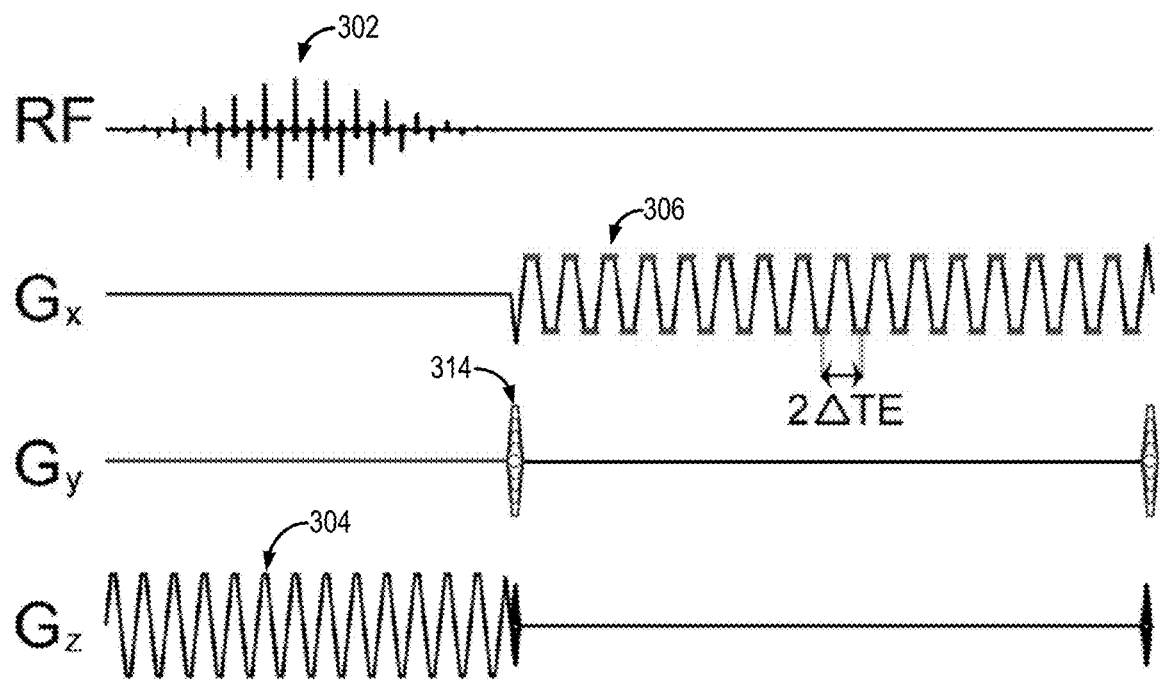
FIG. 3 shows an example dual-echo EPI pulse sequence diagram used for performing a reference scan.
Figure 4:
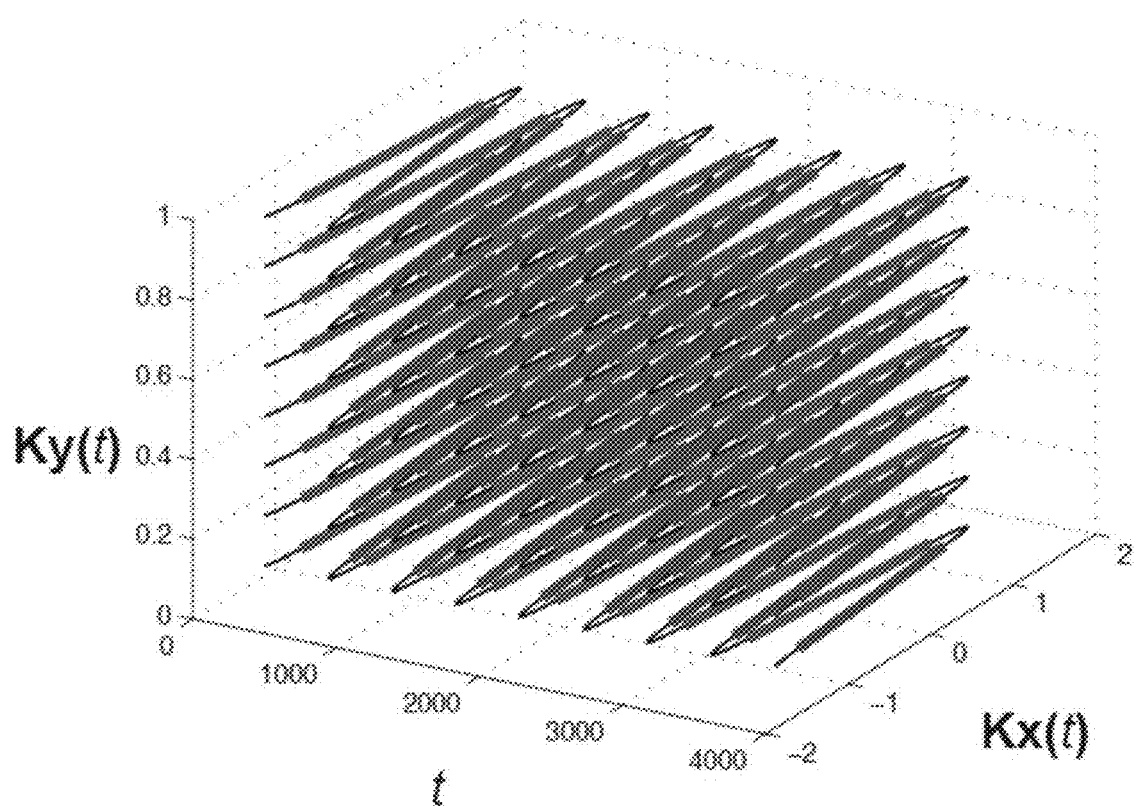
FIG. 4 shows a k-space trajectory traversed by the reference scan dual-echo EPI pulse sequence of FIG. 3.

An example of a reference scan is shown in FIG. 3, and FIG. 4 is an example of the k-space trajectory that is traversed using the pulse sequence of FIG. 3. The reference scan includes an RF excitation 302. The RF excitation 302 may be a spatially selective excitation, a spectrally selective excitation, or a spectral-spatial excitation. In the example shown in FIG. 3, a spectral-spatial RF pulse is shown. To this end, the reference scan may include a spatially selective gradient 304 played out during the RF excitation 302. As an example, the spatially selective gradient 304 can be a slice-select gradient.

Data acquisition is implemented using a readout gradient 306. As one non-limiting example, the readout gradient 306 can be a symmetric EPI readout gradient that includes a number of odd gradient lobes 308 and even gradient lobes 310. Data acquisition can occur during the plateaus of the gradient lobes 308, 310; however, in some embodiments data acquisition may also be implemented during the ramp portions of the gradient lobes 308, 310. Odd gradient echoes are sampled during the odd gradient lobes 308, and even gradient echoes are sampled during the even gradient lobes 310. In the reference scan, the blip gradients 112 in the dual-echo EPI sequence shown in FIG. 1 are replaced with phase-encode gradients 114 prior to the EPI readout, so that the echo asymmetry caused by the readout gradient train 306 is measured as a function of position.

The use of the reference scan in this manner assumes that the blip, slab-select, and slice-encoding gradients contribute negligibly to echo asymmetry, and that the dominant echo asymmetry effect is from the readout gradient. The reference data acquired with the reference scan are acquired from proton magnetic resonance signals. The reference scan may be performed before or directly following the data acquisition of interest (e.g., a hyperpolarized carbon-13 acquisition), or may be performed during a separate scan using a phantom. In order to characterize the asymmetry between the positive and negative readout gradient lobes, the same gradient amplitude is used in both the reference scan and the data acquisition of interest (e.g., the hyperpolarized carbon-13 acquisition).

When the data acquisition of interest acquires data from a different nuclear spin species than the proton signal acquired in the reference scan, a field-of-view ("FOV") reduction will occur in the readout direction of the proton reference scan by a factor of $\gamma_{1H}/\gamma_x$, where $\gamma_x$ is the gyromagnetic ratio of the nuclear spin species that is sampled in the data acquisition of interest. For hyperpolarized carbon-13, this ratio $\gamma_{1H}/\gamma_{13C}$, results in an approximately four-fold FOV reduction. Thus, as an example, starting with a 64 cm readout FOV for a hyperpolarized carbon-13 sequence allows the reference scan to be resolved across a 16 cm FOV. The amplitude of the phase and slice encoding gradients can be scaled by this ratio, $\gamma_{1H}/\gamma_x$, to match the FOV for the data acquisition of interest. For other proton scans (e.g., conventional diffusion tensor imaging), this ratio equals one and no FOV reduction will be present in the reference scan.

Magnetic resonance images acquired within a single exam will generally have consistent SNR during the acquisition; however, directly translating the dynamic dual-echo distortion correction approach to hyperpolarized [1-$^{13}$C]pyruvate imaging can be challenging because of the highly variable SNR of each time resolved volume. Early [1-$^{13}$C]pyruvate time points may lack sufficient signal due to the kinetics of substrate delivery, and late time points are penalized by both $T_1$ relaxation and the consumption of the non-renewable magnetization of hyperpolarized carbon-13. Thus, as described above, high SNR hydrogen-1 phase maps can be obtained either prior to or after a hyperpolarized [1-$^{13}$C] pyruvate imaging exam and used to perform geometric distortion correction in the carbon-13 metabolic maps. If the imaged object was not moved between acquisitions, and the carbon-13 transmit center frequency is on-resonance, then the hydrogen-1 phase maps should account for most major sources of EPI distortion in the carbon-13 images.

Because the exact in vivo carbon-13 resonance frequency cannot be determined until the injection of the hyperpolarized agent, small errors in center frequency calibration may occur. In such instances, the zeroth order off-resonance can be estimated from time averaged, dynamic hyperpolarized [1-$^{13}$C]pyruvate dual-echo EPI data to complement the hydrogen-1 phase maps.

An example dual-echo 3D EPI signal equation and multi-echo reference scan are now described. For the sake of simplicity, the signal equation for one of the two EPI k-space echo data, $S_{1,2}'$, and its corresponding proton reference scans, $R_{1,2}$, are described. The prime notation indicates when images are defined in distorted rather than undistorted coordinates. Ignoring any time-dependence of the imaged object, $\rho(x,y,z) \approx \rho(x,y,z,t)$, the acquired k-space data for the first echo image, $S_1'(m\Delta k_x, n\Delta k_y, l\Delta k_z)$, with matrix size $N_x \times N_y \times N_z$, can be expressed as:

$$S_1'(m\Delta k_x, n\Delta k_y, l\Delta k_z) \approx \iiint \rho(x,y,z) e^{i(m\Delta k_x x + n\Delta k_y y + l\Delta k_z z)} e^{i\omega_1(x,y,z,t)} dx dy dz \quad (4);$$

for $-N_x/2 < m < N_x/2$, $-N_y/2 < n < N_y/2$, and $-N_z/2 < l < N_z/2$, and where $\rho(x,y,z)$ is spin density; $\Delta k_x$, $\Delta k_y$, and $\Delta k_z$ are the k-space increments for each axis; and $\omega_1(x,y,z,t)$ is the EPI phase error term. This latter term, $\omega_1(x,y,z,t)$, contains the spatial distribution of all off-resonance factors including main field inhomogeneity, RF pulse frequency offset, and the time-varying eddy current effects resulting from gradient switching. Provided prior knowledge of the phase error term, $\omega_1(x,y,z,t)$, geometrical distortions in EPI sequences can be corrected through phase demodulation.

Due to the relatively small amplitude of the gradient blips and the low duty cycle of the slice encoding gradients in an EPI pulse sequence, their contribution to $\omega_1(x,y,z,t)$ can typically be dominated by other off-resonance factors. Thus, it can be useful to approximate $S_1'(m\Delta k_x, n\Delta k_y, l\Delta k_z)$ with a simplified phase error term, $\Omega_1(x,y,z,\Delta t_n)$, as follows:

$$S_1'(m\Delta k_x, n\Delta k_y, l\Delta k_z) \approx \iiint \rho(x,y,z) e^{i(m\Delta k_x + n\Delta k_y + l\Delta k_z)} e^{i\Omega_1(x,y,z,\Delta t_n)\Delta t_n} dx\,dy\,dz \quad (5);$$

For $0 < t_n < (N_y-1)\Delta T_{blip}$, where $\Delta T_{blip} = 2\Delta TE$ is the period between successive $k_y$ lines. The simplified phase error term, $\Omega_1(x,y,z,\Delta t_n)$ describes the average frequency over the time $\Delta t_n$, and can be estimated from a multi-echo reference scan, $R_1(m\Delta k_x, n\Delta k_y, l\Delta k_z, \Delta t_n)$ with matrix size $N_x \times N_y \times N_z \times N_t$, where $N_t = N_y$ and, $$R_1(m\Delta k_x, n\Delta k_y, l\Delta k_z, \Delta t_n) \approx \iiint \rho(x,y,z) e^{i(m\Delta k_x + n\Delta k_y + l\Delta k_z)} e^{i\Omega_1(x,y,z,\Delta t_n)\Delta t_n} dx\,dy\,dz \quad (6).$$

The reference scan, $R_1$, can be acquired at $N_t = N_y$ successive echo times that correspond to the relative acquisition times for each gradient echo in the readout train. The multi-echo reference scan is effectively a low spectral resolution, 3D echo-planar spectroscopic imaging sequence that can be implemented by removing the blip gradients from the readout train and using conventional phase-encoding gradients. Thus, the phase error that would have accumulated across the blip direction in k-space during a single-shot EPI readout can be tracked and accounted for.

An example for extracting the phase error term from such reference data, and how that phase error term can be applied to correct geometric distortions in EPI, is now described.

Letting $r_1(m\Delta x, n\Delta y, l\Delta z)$ be the inverse spatial Fourier transform of $R_1(m\Delta k_x, n\Delta k_y, l\Delta k_z)$, where x, y and z are the spatial increments for each axis, $r_1$ can be used to compute a set of phase maps, $M_1(m\Delta x, n\Delta y, l\Delta z, \Delta t_n)$ that track differential phase accumulation across the blip direction in k-space due to off-resonance sources. The phase map for the $n^{th}$ pair of gradient-echoes can be computed as the angle of the complex quotient of the $n^{th}$ reference image to the first, $$M_1(m\Delta x, n\Delta y, l\Delta z, \Delta t_n) = e^{i \angle \left( \frac{r_1(m\Delta x, n\Delta y, l\Delta z, \Delta t_n)}{r_1(m\Delta x, n\Delta y, l\Delta z, \Delta t_1)} \right)}. \quad (7)$$

The phase map matrix, $M_1$, in Eqn. (7) can be explicitly cast as a unit-magnitude phasor. Given a set of phase maps, $M_1$, a multi-echo modulation can transform an undistorted image into distorted coordinates by introducing phase accrual across the blip direction of k-space. For example, let $r_{11}(m\Delta x, n\Delta y, l\Delta z, \Delta t_n)$ be a single image from a set of $N_t$ undistorted reference images, $r_1$, and let $M_{\Delta t_n} = M_1(\ldots, \Delta t_n)$ be the $n^{th}$ phase map. The product $r_{11} \cdot M_{\Delta t_n}$ has added phase that accounts for the accumulation of off-resonance terms after the $n^{th}$ pair of gradient echoes. The Fourier transform of $r_{11} \cdot M_{\Delta t_n}$ provides the $n^{th}$ readout plane of the distorted k-space data matrix, $R_{11}'(m\Delta k_x, n\Delta k_y, l\Delta k_z)$, $$R_{11}'(m\Delta k_x, n\Delta k_y, l\Delta k_z) = \mathcal{F}\{r_{11} \cdot M_{\Delta t_n}\}|_{m\Delta k_x, n\Delta k_y, l\Delta k_z} \quad (8).$$

Figure 5:
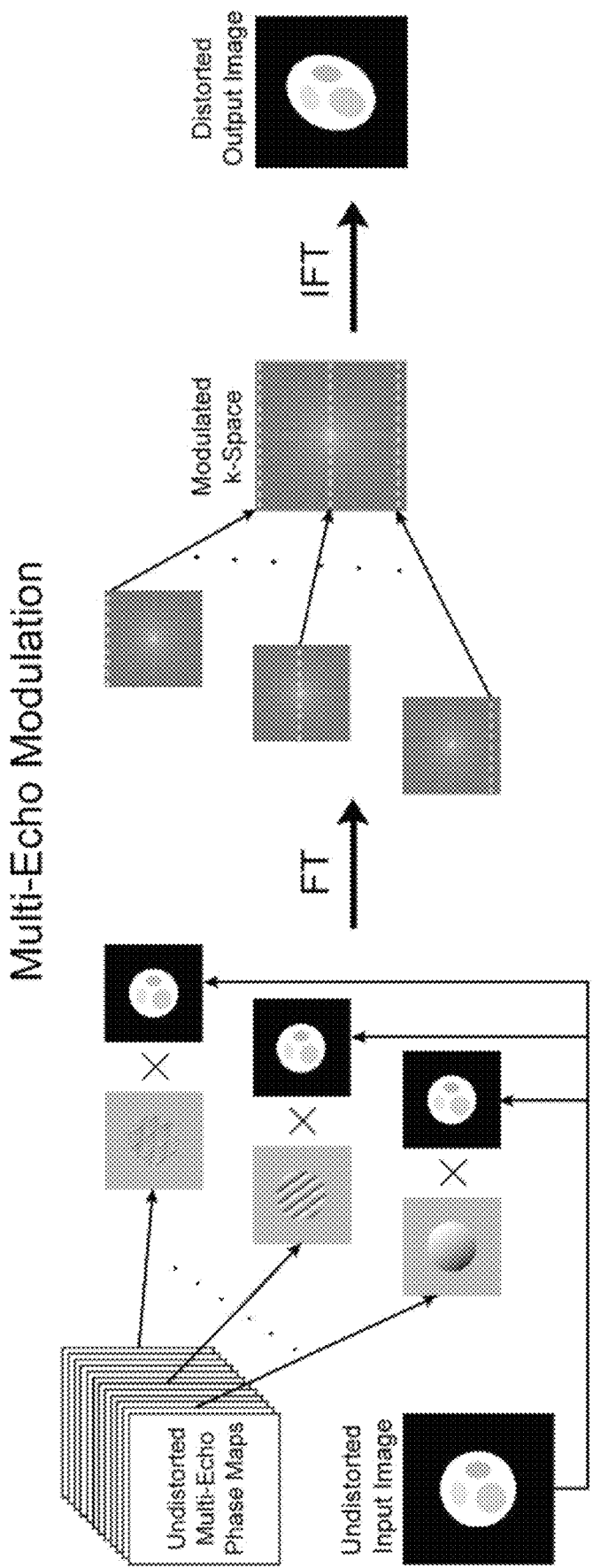
FIG. 5 is a flow diagram illustrating an example phase modulation to generate images in a distorted coordinate space from undistorted images.

Using Eqn. (8), each of the $N_y$ readout planes of $R_{11}'$ can be separately derived with their corresponding phase maps. Computing the inverse Fourier transform of the resulting matrix gives the final image, $r_{11}'$, in distorted coordinates. This forward process of image transformation in Eqn. (8) can be referred to in the present disclosure as multi-echo modulation. A flow diagram showing the general steps for multi-echo modulation is shown in FIG. 5.

Off-resonance artifacts in EPI data, $S_1'$, can be corrected with the inverse of this procedure, multi-echo demodulation, provided a set of phase maps, $M_1'$, that are defined in the same distorted EPI coordinate space. In order to compute $M_1'$, a set of distorted reference scan data $R_1'$ can be obtained by separately applying the multi-echo modulation of Eqn. (8) on each of the $N_t$ undistorted reference images, $r_1$. The resulting images, $r_1'$, can then be used to produce conjugate phase maps, $M_1'$, in the distorted coordinates, $$M_1'(m\Delta x, n\Delta y, l\Delta z, \Delta t_n) = e^{i \angle \left( \frac{r_1'(m\Delta x, n\Delta y, l\Delta z, \Delta t_n)}{r_1'(m\Delta x, n\Delta y, l\Delta z, \Delta t_1)} \right)}. \quad (9)$$

Figure 6:
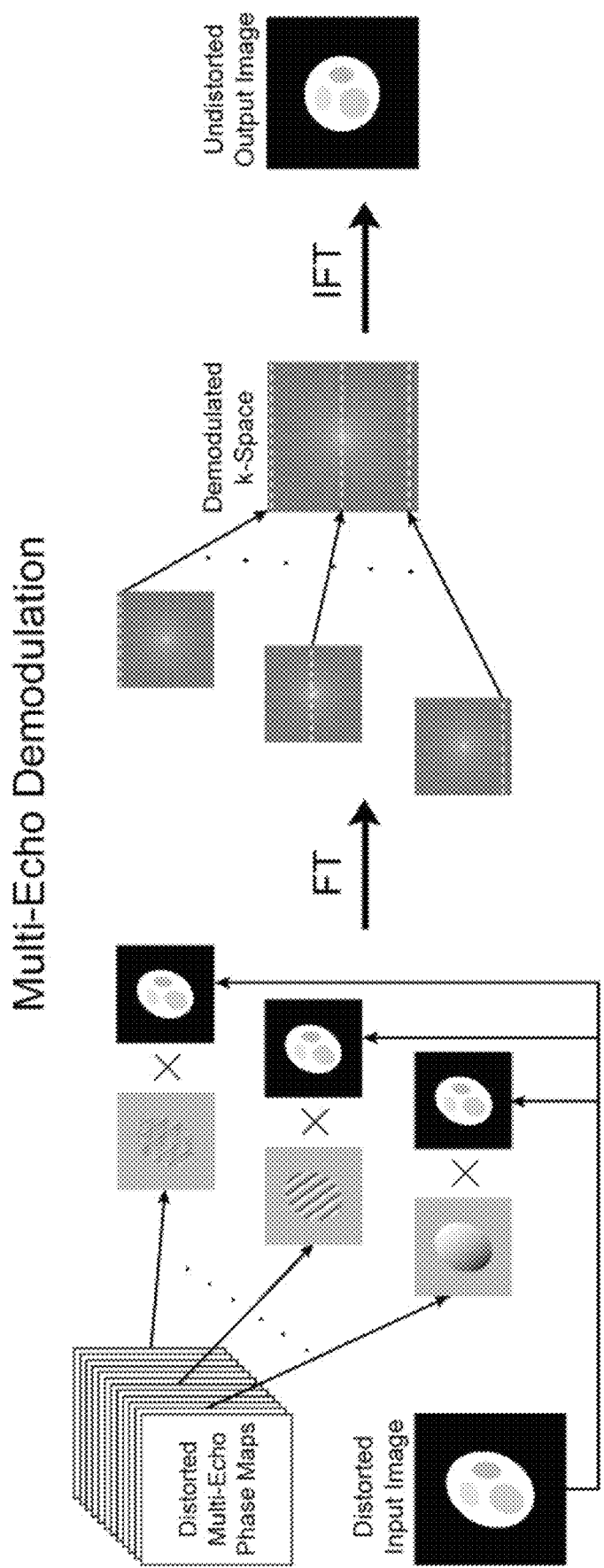
FIG. 6 is a flow diagram illustrating an example phase demodulation to generate undistorted images from distorted images that are in a distorted coordinate space.

The corrected EPI k-space data, $S_1$, can be reconstructed through multi-echo demodulation using the distorted phase maps, $M_1'$, from Eqn. (9), $$S_1(m\Delta k_x, n\Delta k_y, l\Delta k_z) = \mathcal{F}\{s_1' \cdot M_{\Delta t_n}'^*\}|_{m\Delta k_x, n\Delta k_y, l\Delta k_z} \quad (10);$$

where $s_1'$ is the inverse Fourier transform of $S_1'$. The final images, $s_{1,2}$, can be separately reconstructed with phase maps computed from their respective reference scans, $R_{1,2}$. A flow diagram showing the general steps for multi-echo demodulation is shown in FIG. 6.

The preceding example described how a multi-echo reference scan can be used to reconstruct off-resonance corrected dual-echo 3D EPI images, $s_{1,2}'(m\Delta x, n\Delta y, l\Delta z)$. In practice, it can be reasonable to assume that with the exception of the zeroth order term owing to the a priori uncertainty of the experimental in vivo carbon-13 resonance frequency, most major sources of distortion in a hyperpolarized carbon-13 EPI acquisition can be accounted for by data acquired from a hydrogen-1 multi-echo reference scan. Implementation details for rectifying proton acquired phase maps with carbo-13 dual-echo 3D EPI images, and for estimating the carbon-13 center frequency offset, are described below.

Figure 7:
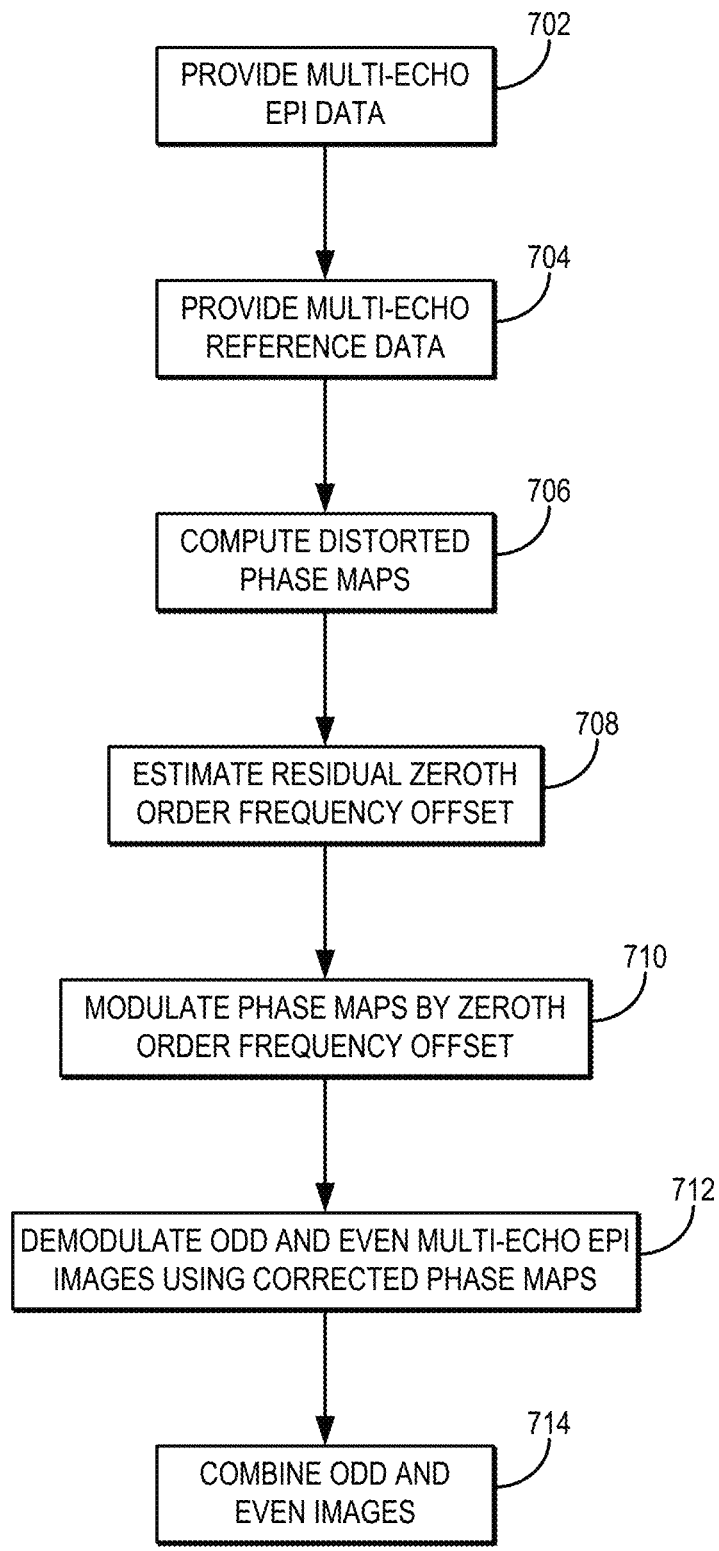
FIG. 7 is a flowchart setting forth the steps of an example method for reconstructing distortion free images from data acquired using a multi-echo EPI pulse sequence.

Referring now to FIG. 7, a flowchart is illustrated as setting forth the steps of an example method for reconstructing an image from data acquired using a multi-echo EPI sequence (e.g., a dual-echo EPI sequence). The method includes providing multi-echo EPI data to a computer system, as indicated at step 702. Providing these data can include retrieving previously acquired data from a memory or data storage, or acquiring the data with an MRI system. The computer system can form a part of the MRI system (e.g., an operator or networked workstation), or can be a physically distinct computer system. The multi-echo EPI data are acquired using a multi-echo EPI pulse sequence. In some embodiments, the multi-echo EPI data are acquired using a dual-echo EPI sequence, thus in these instances the provided data includes data associated with a first echo time and data associated with a second echo time. As one example, the provided data can be acquired using a hyperpolarized carbon-13 acquisition, in which an agent containing hyperpolarized carbon-13 is administered to the subject before imaging; however, the provided data can also be acquired using other MRI acquisitions, including diffusion imaging and time-resolved acquisitions.

Multi-echo reference data are also provided to the computer system, as indicated at step 704. Like the multi-echo EPI data, the multi-echo reference data can be provided by retrieving previously acquired reference data from a memory or data storage, or by acquiring the reference data with the MRI system. The multi-echo reference data are generally acquired using the same EPI readout used to acquire the dual-echo EPI data. In general, the multi-echo reference data are acquired from proton (e.g., hydrogen-1) spins.

The image reconstruction described in the present disclosure generally proceeds in two stages: a zeroth order frequency, $\Delta f_0$, estimation and an off-resonance correction.

Odd and even readouts from the multi-echo EPI data can be separated and individually processed.

From the multi-echo reference data, distorted phase maps, $M_{1,2}'$, are generated, as indicated at step 706. In general, these distorted phase maps, $M_{1,2}'$, indicate phase in the distorted coordinate space resulting from the multi-echo EPI acquisition used to acquire the multi-echo EPI data. The residual zeroth order frequency offset, $\Delta f_0$, is estimated based in part on these distorted phase maps, as indicated at step 708. The distorted phase maps are then modulated by the zeroth order frequency offset, as indicated at step 710.

In one non-limiting example, the zeroth order frequency offset, $\Delta f_0$, can be estimated as follows. The distorted phase maps, $M_{1,2}'$, are used to demodulate the multi-echo EPI data, $S_{1,2}'$, to produce the images, $s_{1,2}$. The zeroth order frequency offset can be estimated based on these images, $s_{1,2}$, as follows, $$\Delta f_0 = \frac{1}{2\pi \Delta TE \cdot N_{ROI}} \sum_{m}^{N_x} \sum_{n}^{N_y} \sum_{l}^{N_z} \angle \left\{ \frac{s_2(m\Delta x, n\Delta y, l\Delta z)}{s_1(m\Delta x, n\Delta y, l\Delta z)} \right\}. \quad (11)$$

$$ROI(m\Delta x, n\Delta y, l\Delta z);$$

where $ROI(m\Delta x, n\Delta y, l\Delta z)$ is a binary mask. The binary mask includes $N_{ROI}$ voxels that can be automatically selected by thresholding the multi-echo EPI images at a selected SNR level, which may be selected as an SNR level of 15 as one example.

The original time-resolved multi-echo EPI images are then corrected via multi-echo demodulation with the echo asymmetry and bulk off-resonance compensated phase maps, thereby producing odd and even reconstructed images, as indicated at step 712. The final reconstructed image of the subject is then produced by combining the odd and even images, as indicated at step 714. As one example, the odd and even images can be combined by computing a complex sum of the two corrected images.

Figure 8:
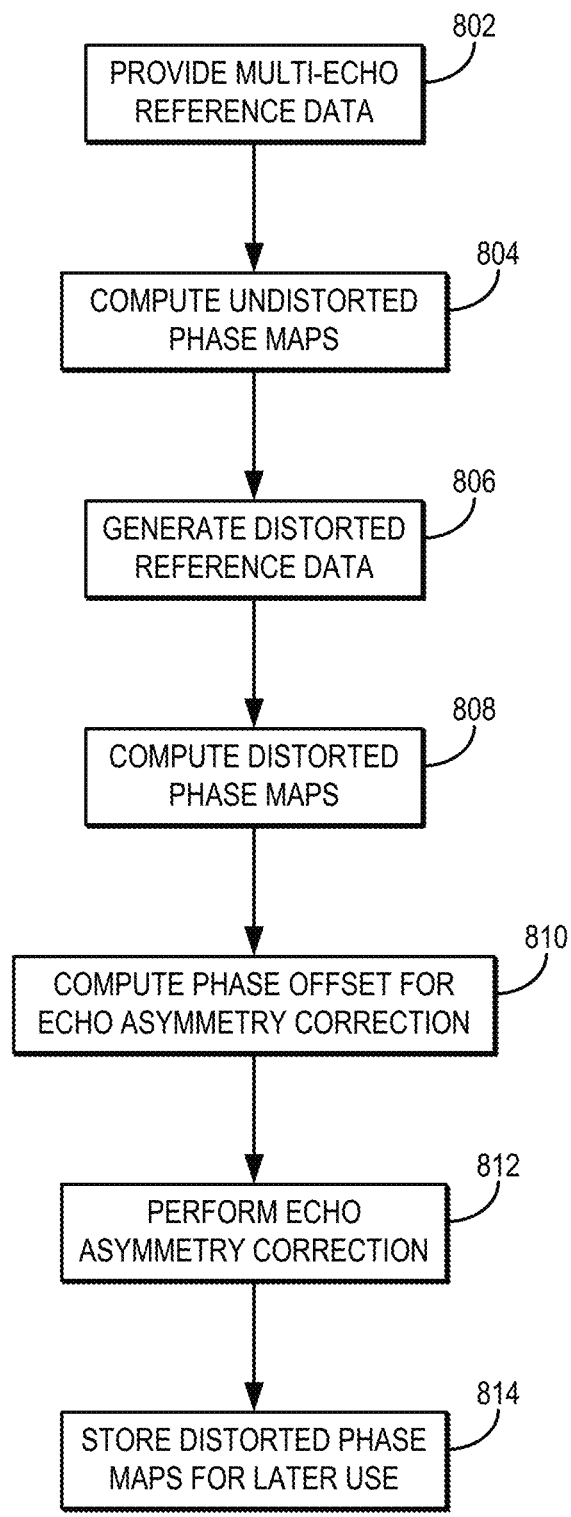
FIG. 8 is a flowchart setting forth the steps of an example method for generating distorted phase maps indicating phase values in a distorted coordinate space associated with geometric distortions related to a multi-echo EPI acquisition.

Referring now to FIG. 8, a flowchart is illustrated as setting forth the steps of an example method for generating distorted phase maps from multi-echo reference data. The method includes providing the multi-echo reference data to a computer system, as described above and indicated at step 802.

Odd and even readouts from the multi-echo reference data can be separated and individually processed. Initial undistorted phase maps, $M_{1,2}$, are computed from the multi-echo reference data, $R_{1,2}$, as indicated at step 804. As an example, the undistorted phase maps, $M_{1,2}$, can be computed based on Eqn. (7). Because the resulting phase maps contain off-resonance phase accrual measured from hydrogen-1 sources, the phase from each voxel in the phase maps, $M_{1,2}$, can be one-dimensionally unwrapped with respect to $\Delta t_n$. When the multi-echo EPI data are acquired from a different nuclear spin species than the reference multi-echo data (e.g., from hyperpolarized carbon-13), a scaling factor is computed between the gyromagnetic ratios of the two nuclear spin species as, $\gamma_{1H}/\gamma_x$, where $\gamma_x$ is the gyromagnetic ratio of the nuclear spin species that is sampled in the multi-echo EPI data acquisition. This scaling factor is then applied to the undistorted phase maps, $M_{1,2}$.

Distorted reference data, $R_{1,2}'$, are then generated as indicated at step 806. As an example, the distorted reference data, $R_{1,2}'$, can be generated using multi-echo modulation based on Eqn. (8), using the undistorted phase maps, $M_{1,2}$, as input. Distorted phase maps, $M_{1,2}'$, can then be computed from the distorted reference data, $R_{1,2}'$, as indicated at step 808. The distorted phase maps can be computed using the same process as used to compute the undistorted phase maps.

When the multi-echo EPI data are acquired from a different nuclear spin species than the reference multi-echo data, the phase maps can be resampled to the field-of-view of the multi-echo EPI data. The phase maps can also be smoothed, such as by convolving the phase maps with a smoothing kernel, which may be a Gaussian kernel, in order to regularize potential phase errors.

To account for echo asymmetry between even and odd echoes, a phase offset is computed, as indicated at step 810. As one example, the phase offset, $\theta_\varepsilon$, can be estimated by computing a dual-echo phase map from the reference multi-echo data, $r_{1,2}$, and taking the mean value according to, $$\theta_\varepsilon = \frac{(\gamma_{13C}/\gamma_{1H})}{N_t \cdot N_{ROI}} \sum_{m}^{N_x} \sum_{n}^{N_y} \sum_{l}^{N_z} \sum_{\Delta t_n}^{N_t} \angle \left\{ \frac{r_2(m\Delta x, n\Delta y, l\Delta z, \Delta t_n)}{r_1(m\Delta x, n\Delta y, l\Delta z, \Delta t_n)} \right\}. \quad (12)$$

$$ROI(m\Delta x, n\Delta y, l\Delta z).$$

The binary mask, $ROI(m\Delta x, n\Delta y, l\Delta z)$, includes $N_{ROI}$ voxels that can be automatically selected by thresholding the reference images at a selected SNR level, which may be selected as an SNR level of 50 as one example. Eqn. (12) is motivated by the assumption that if the hydrogen-1 center frequency is on-resonance, then the zeroth order phase difference between the odd and even reference images should be negligible. However, echo asymmetry can give rise to a residual phase distribution that can be approximated with a bulk offset, $\theta_\varepsilon$.

The computed phase offset, $\theta_\varepsilon$, can then be applied to the distorted phase maps, $M_1'$, as indicated at step 812. For instance, the factor, $e^{i\theta_\varepsilon}$, can be multiplied with the distorted phase maps, $M_1'$, so that the resulting multi-echo demodulated data are corrected for the erroneous phase offset between odd and even images. The distorted phase maps, $M_1'$, are then stored for later use (e.g., by the image reconstruction described above), as indicated at step 814.

Figure 9:
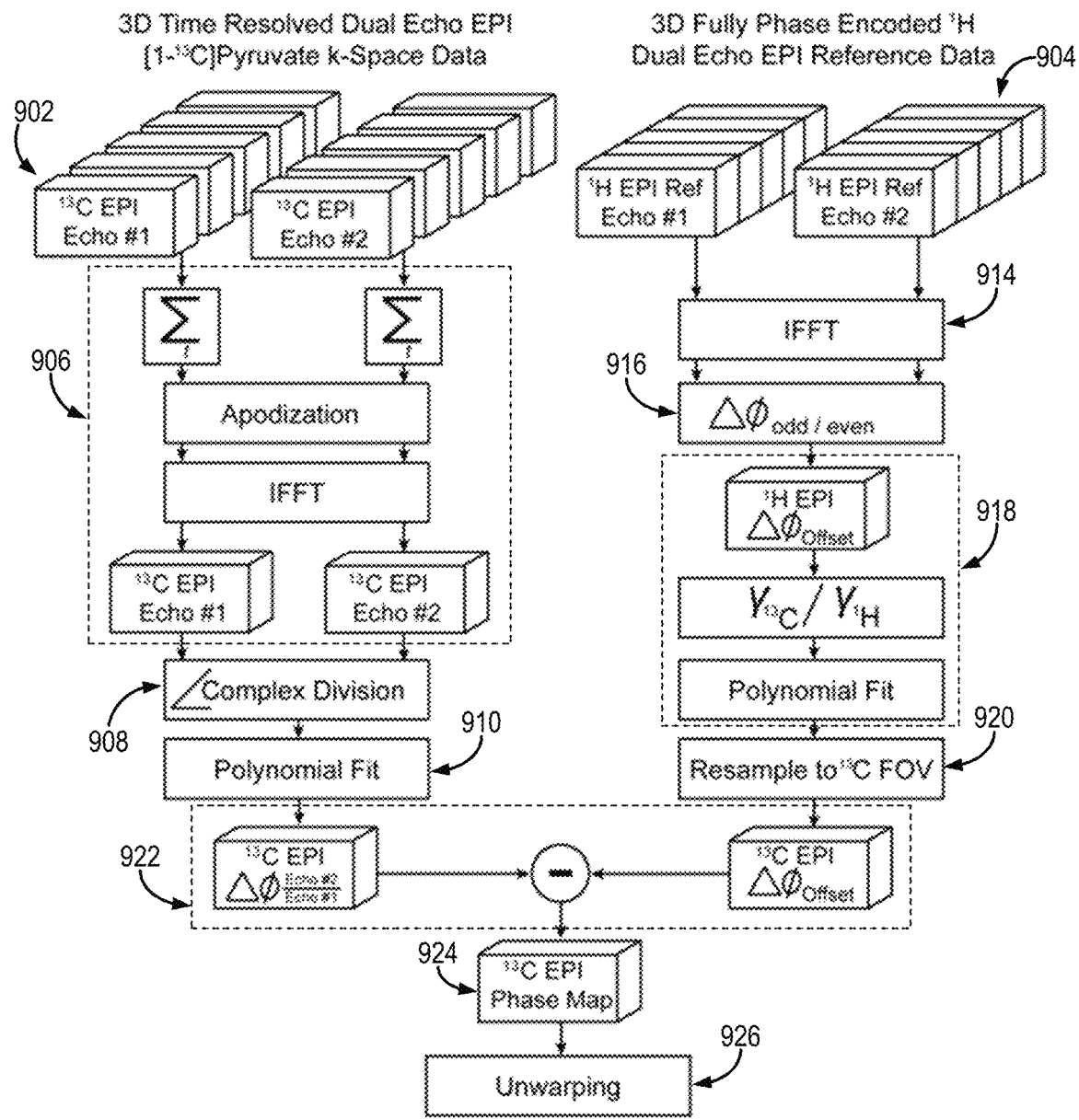
FIG. 9 is a flowchart setting forth the steps of an example method for producing distortion free images using a dual-echo EPI pulse sequence that encodes field map information in the acquired data, such that a separate field mapping acquisition is not required.

Referring now to FIG. 9, a flowchart is illustrated as setting forth the steps of another example method for reconstructing an image from data acquired using a multi-echo EPI sequence (e.g., a dual-echo EPI sequence) where that image has been corrected for off-resonance effects (e.g., distortions) using a field map encoded from the acquired data.

The method includes providing multi-echo EPI data to a computer system, as indicated at step 902. Providing these data can include retrieving previously acquired data from a memory or data storage, or acquiring the data with an MRI system. The computer system can form a part of the MRI system (e.g., an operator or networked workstation), or can be a physically distinct computer system. The multi-echo EPI data are acquired using a multi-echo EPI pulse sequence. In some embodiments, the multi-echo EPI data are acquired using a dual-echo EPI sequence, thus in these instances the provided data includes data associated with a first echo time and data associated with a second echo time. As one example, the provided data can be acquired using a hyperpolarized carbon-13 acquisition, in which an agent containing hyperpolarized carbon-13 is administered to the subject before imaging; however, the provided data can also be acquired using other MRI acquisitions, including diffusion imaging and time-resolved acquisitions.

Multi-echo reference data are also provided to the computer system, as indicated at step 904. Like the multi-echo EPI data, the multi-echo reference data can be provided by retrieving previously acquired reference data from a memory or data storage, or by acquiring the reference data with the MRI system. The multi-echo reference data are generally acquired using the same EPI readout used to acquire the dual-echo EPI data. In general, the multi-echo reference data are acquired from proton (e.g., hydrogen-1) spins.

From the provided multi-echo EPI data, a first echo image and a second echo image are produced, as indicated at step 906. As one example, producing the first echo image can include temporally summing time-resolved data acquired at the first echo time, apodizing the summed data, and performing a Fourier transform reconstruction. Likewise, the second echo image can be produced by temporally summing time-resolved data acquired at the second echo time, apodizing the summed data, and performing a Fourier transform reconstruction. It will be appreciated, however, that any suitable image reconstruction technique can be implemented for generating the first and second echo images from the provided data.

The first and second echo images are then used to calculate an initial field map, as indicated at step 908. For example, the first and second echo images can be inputted to Eqn. (2). The initial field map is then fit to a polynomial surface, as indicated at step 910. As one example, the polynomial surface can be a second degree polynomial surface. The fit can be applied using a weighting procedure, where the weights are taken as the square of the magnitude of each pixel in the summed set.

To account for echo asymmetry, the multi-echo reference data provided step 904 are used. The reference data is separated into odd and even echoes (e.g., data acquired at the first echo time and at the second echo time), from which odd echo and even echo images are reconstructed, as indicated at step 914. The phase difference between two even echoes and one odd echo and one even echo is then computed, as indicated at step 916. This phase difference provides the asymmetry correction. Ideally, the phase difference between matching echoes provides off-resonance information, while the difference between opposing echoes contains both the same off-resonance information as well as the echo asymmetry. Subtracting the even-even and odd-even phase images results in cancellation of the off-resonance information while preserving the echo asymmetry term.

The residual term, $\Delta\phi_{offset}$, is subsequently fit to a polynomial, as indicated at step 918. As mentioned above, when the data acquisition of interest acquires data from a different nuclear spin species than the proton signal acquired in the reference scan, a field-of-view ("FOV") reduction will occur in the readout direction of the proton reference scan by a factor of $\gamma_{1H}/\gamma_x$, where $\gamma_x$ is the gyromagnetic ratio of the nuclear spin species that is sampled in the data acquisition of interest. In these instances, the echo asymmetry term can be scaled by this ratio, $\gamma_{1H}/\gamma_x$, to match the FOV for the data acquisition of interest. The echo asymmetry term can be resampled to match readout FOV of the data acquisition of interest, as indicated at step 920.

The final field map is then calculated at step 922 by subtracting the fitted echo asymmetry term from the fitted field map produced in step 910. The field map can then be converted to a pixel shift map in units of pixels by dividing it by $BW_{pp}$, as indicated at step 924. The pixel shift map can then be used for distortion correction in image space for each pixel independently, as indicated at step 926. Each pixel in the distorted EPI images is extracted and then shifted by the amount prescribed by the pixel shift map. The shifted pixel images can also be added together to generate distortion corrected data sets.

Figure 10:
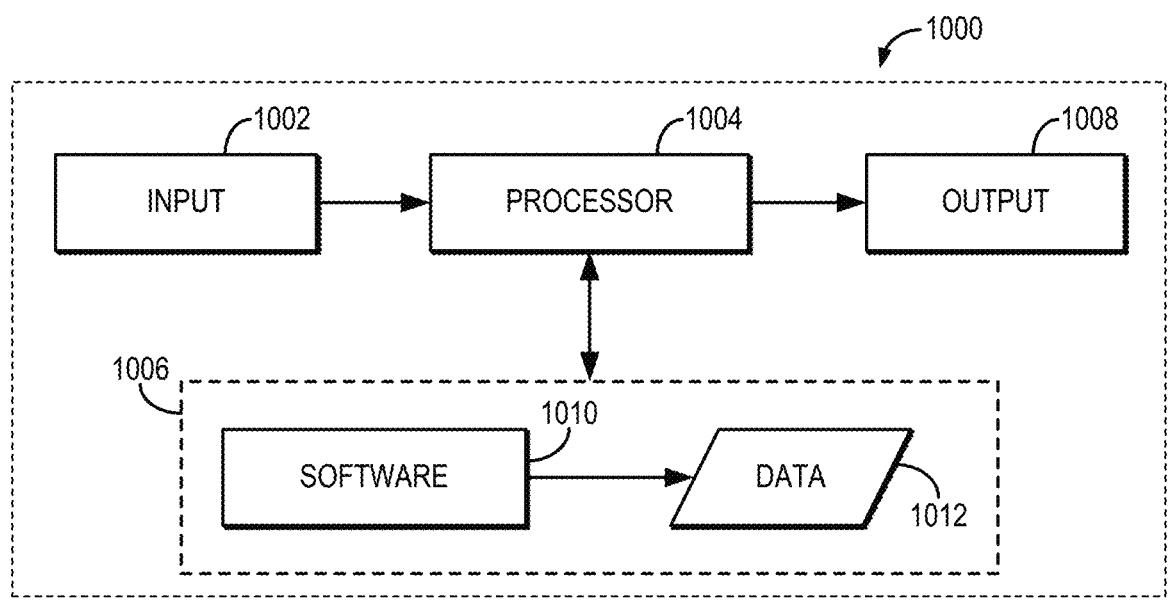
FIG. 10 is a block diagram of an example image reconstruction unit implemented with a hardware processor and a memory, which can implement the methods described in the present disclosure.

Referring now to FIG. 10, a block diagram of an example of an image reconstruction unit 1000 that can perform the methods described in the present disclosure is shown. The image reconstruction unit 1000 is generally implemented with a hardware processor 1004 and a memory 1006.

The image reconstruction unit 1000 includes an input 1002, at least one hardware processor 1004, a memory 1006, and an output 1008. The image reconstruction unit 1000 can also include any suitable device for reading computer-readable storage media. The image reconstruction unit 1000 may be implemented, in some examples, a workstation, a notebook computer, a tablet device, a mobile device, a multimedia device, a network server, a mainframe, or any other general-purpose or application-specific computing device. The image reconstruction unit 1000 may operate autonomously or semi-autonomously, or may read executable software instructions from the memory 1006 or a computer-readable medium (e.g., a hard drive, a CD-ROM, flash memory), or may receive instructions via the input 1002 from a user, or any another source logically connected to a computer or device, such as another networked computer or server. In general, the image reconstruction unit 1000 is programmed or otherwise configured to implement the methods and algorithms described above.

The input 1002 may take any suitable shape or form, as desired, for operation of the image reconstruction unit 1000, including the ability for selecting, entering, or otherwise specifying parameters consistent with performing tasks, processing data, or operating the image reconstruction unit 1000. In some aspects, the input 1002 may be configured to receive data, such as multi-echo EPI data and reference multi-echo data acquired with an MRI system. Such data may be processed as described above to reconstruct an image, which may be a two-dimensional or three-dimensional image. In addition, the input 1002 may also be configured to receive any other data or information considered useful for reconstructing an image from the acquired multi-echo EPI data using the methods described above.

Among the processing tasks for operating the image reconstruction unit 1000, the at least one hardware processor 1004 may also be configured to carry out any number of post-processing steps on data received by way of the input 1002.

The memory 1006 may contain software 1010 and data 1012, such as data acquired with a measurement system, and may be configured for storage and retrieval of processed information, instructions, and data to be processed by the at least one hardware processor 1004. In some aspects, the software 1010 may contain instructions directed to reconstructing images from the multi-echo EPI data acquired with an MRI system.

In addition, the output 1008 may take any shape or form, as desired, and may be configured for displaying, in addition to other desired information, reconstructed images.

Figure 11:
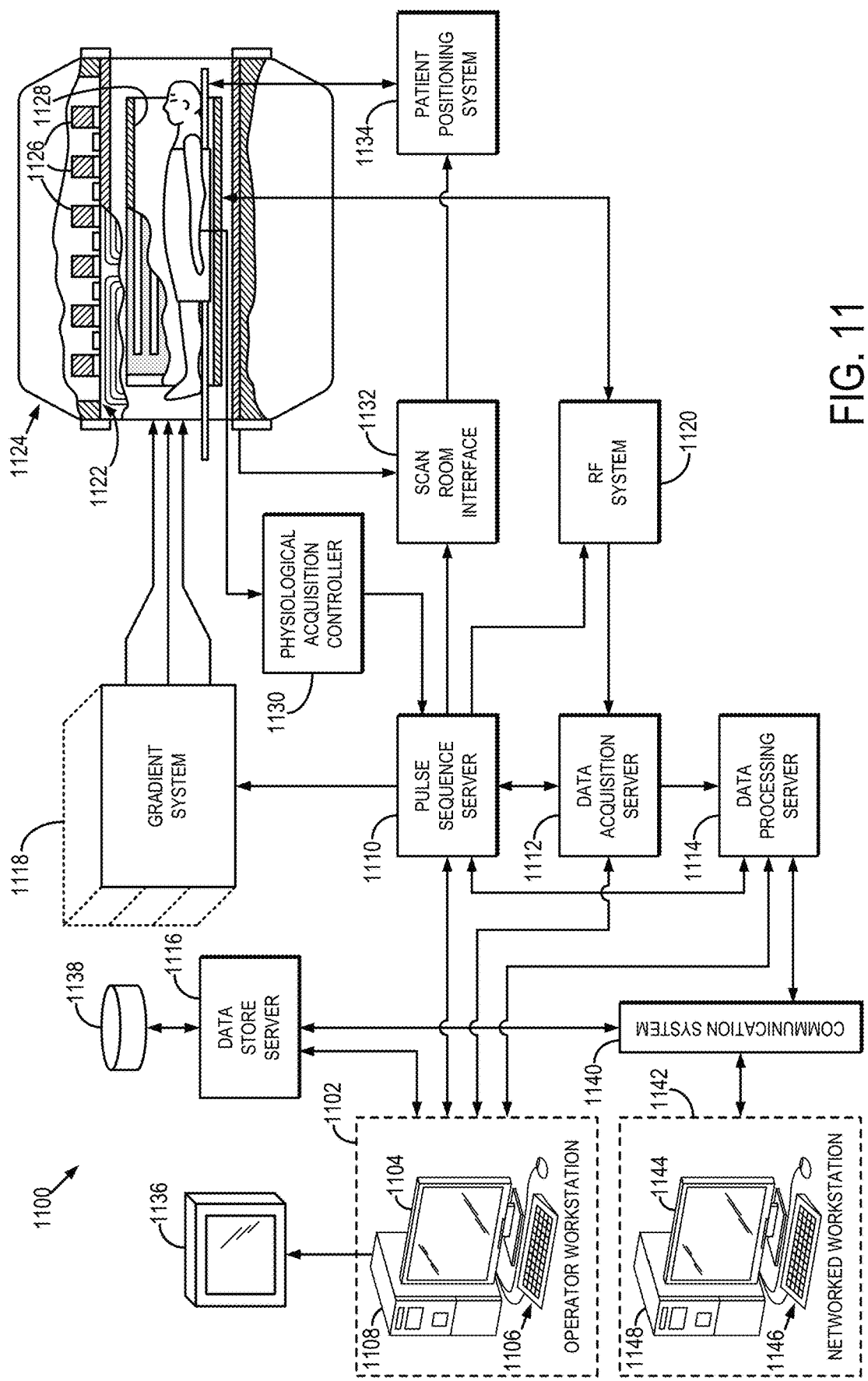
FIG. 11 is a block diagram of an example magnetic resonance imaging system that can implement the methods described in the present disclosure.

Referring particularly now to FIG. 11, an example of a magnetic resonance imaging ("MRI") system 1100 that can implement the methods described here is illustrated. The MRI system 1100 includes an operator workstation 1102 that may include a display 1104, one or more input devices 1106 (e.g., a keyboard, a mouse), and a processor 1108. The processor 1108 may include a commercially available programmable machine running a commercially available operating system. The operator workstation 1102 provides an operator interface that facilitates entering scan parameters into the MRI system 1100. The operator workstation 1102 may be coupled to different servers, including, for example, a pulse sequence server 1110, a data acquisition server 1112, a data processing server 1114, and a data store server 1116. The operator workstation 1102 and the servers 1110, 1112, 1114, and 1116 may be connected via a communication system 1140, which may include wired or wireless network connections.

The pulse sequence server 1110 functions in response to instructions provided by the operator workstation 1102 to operate a gradient system 1118 and a radiofrequency ("RF") system 1120. Gradient waveforms for performing a prescribed scan are produced and applied to the gradient system 1118, which then excites gradient coils in an assembly 1122 to produce the magnetic field gradients $G_x$, $G_y$, and $G_z$ that are used for spatially encoding magnetic resonance signals. The gradient coil assembly 1122 forms part of a magnet assembly 1124 that includes a polarizing magnet 1126 and a whole-body RF coil 1128.

RF waveforms are applied by the RF system 1120 to the RF coil 1128, or a separate local coil to perform the prescribed magnetic resonance pulse sequence. Responsive magnetic resonance signals detected by the RF coil 1128, or a separate local coil, are received by the RF system 1120. The responsive magnetic resonance signals may be amplified, demodulated, filtered, and digitized under direction of commands produced by the pulse sequence server 1110. The RF system 1120 includes an RF transmitter for producing a wide variety of RF pulses used in MRI pulse sequences. The RF transmitter is responsive to the prescribed scan and direction from the pulse sequence server 1110 to produce RF pulses of the desired frequency, phase, and pulse amplitude waveform. The generated RF pulses may be applied to the whole-body RF coil 1128 or to one or more local coils or coil arrays.

The RF system 1120 also includes one or more RF receiver channels. An RF receiver channel includes an RF preamplifier that amplifies the magnetic resonance signal received by the coil 1128 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M = \sqrt{I^2 + Q^2} \qquad (13);$$

and the phase of the received magnetic resonance signal may also be determined according to the following relationship:

$$\varphi = \tan^{-1}\left(\frac{Q}{I}\right). \qquad (14)$$

The pulse sequence server 1110 may receive patient data from a physiological acquisition controller 1130. By way of example, the physiological acquisition controller 1130 may receive signals from a number of different sensors connected to the patient, including electrocardiograph ("ECG") signals from electrodes, or respiratory signals from a respiratory bellows or other respiratory monitoring devices. These signals may be used by the pulse sequence server 1110 to synchronize, or "gate," the performance of the scan with the subject's heart beat or respiration.

The pulse sequence server 1110 may also connect to a scan room interface circuit 1132 that receives signals from various sensors associated with the condition of the patient and the magnet system. Through the scan room interface circuit 1132, a patient positioning system 1134 can receive commands to move the patient to desired positions during the scan.

The digitized magnetic resonance signal samples produced by the RF system 1120 are received by the data acquisition server 1112. The data acquisition server 1112 operates in response to instructions downloaded from the operator workstation 1102 to receive the real-time magnetic resonance data and provide buffer storage, so that data is not lost by data overrun. In some scans, the data acquisition server 1112 passes the acquired magnetic resonance data to the data processor server 1114. In scans that require information derived from acquired magnetic resonance data to control the further performance of the scan, the data acquisition server 1112 may be programmed to produce such information and convey it to the pulse sequence server 1110. For example, during pre-scans, magnetic resonance data may be acquired and used to calibrate the pulse sequence performed by the pulse sequence server 1110. As another example, navigator signals may be acquired and used to adjust the operating parameters of the RF system 1120 or the gradient system 1118, or to control the view order in which k-space is sampled. In still another example, the data acquisition server 1112 may also process magnetic resonance signals used to detect the arrival of a contrast agent in a magnetic resonance angiography ("MRA") scan. For example, the data acquisition server 1112 may acquire magnetic resonance data and processes it in real-time to produce information that is used to control the scan.

The data processing server 1114 receives magnetic resonance data from the data acquisition server 1112 and processes the magnetic resonance data in accordance with instructions provided by the operator workstation 1102. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 1114 are conveyed back to the operator workstation 1102 for storage. Real-time images may be stored in a data base memory cache, from which they may be output to operator display 1102 or a display 1136. Batch mode images or selected real time images may be stored in a host database on disc storage 1138. When such images have been reconstructed and transferred to storage, the data processing server 1114 may notify the data store server 1116 on the operator workstation 1102. The operator workstation 1102 may be used by an operator to archive the images, produce films, or send the images via a network to other facilities.

The MRI system 1100 may also include one or more networked workstations 1142. For example, a networked workstation 1142 may include a display 1144, one or more input devices 1146 (e.g., a keyboard, a mouse), and a processor 1148. The networked workstation 1142 may be located within the same facility as the operator workstation 1102, or in a different facility, such as a different healthcare institution or clinic.

The networked workstation 1142 may gain remote access to the data processing server 1114 or data store server 1116 via the communication system 1140. Accordingly, multiple networked workstations 1142 may have access to the data processing server 1114 and the data store server 1116. In this manner, magnetic resonance data, reconstructed images, or other data may be exchanged between the data processing server 1114 or the data store server 1116 and the networked workstations 1142, such that the data or images may be remotely processed by a networked workstation 1142.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing distortion-free images using a magnetic resonance imaging (MRI) system, the steps of the method comprising:
   (a) providing to a computer system, multi-echo data acquired from a subject using an MRI system operating a multi-echo echo planar imaging (EPI) pulse sequence to acquire the multi-echo data by sampling magnetic resonance signals from a first nuclear spin species;
   (b) providing to a computer system, reference multi-echo data acquired from the subject using the MRI system operating a multi-echo EPI pulse sequence to acquire the reference multi-echo data by sampling magnetic resonance signals from a second nuclear spin species;
   (c) computing distorted phase maps from the reference multi-echo data using the computer system, the distorted phase maps indicating a distorted coordinate space that represents geometric distortions arising from the multi-echo EPI pulse sequence;
   (d) reconstructing a first image from multi-echo data acquired at a first echo time and a second image from multi-echo data acquired at a second echo time in the multi-echo EPI pulse sequence;
   (e) generating undistorted first and second images by demodulating the first and second images using the distorted phase maps; and
   (f) generating an undistorted image of the subject by combining the undistorted first and second images.

2. The method as recited in claim 1, wherein step (e) further includes estimating a residual zeroth order frequency offset from the undistorted first and second images, modulating the distorted phase maps by the estimated residual zeroth order frequency offset to generate updated distorted phase maps, and generating updated undistorted first and second images by demodulating the first and second images using the updated distorted phase maps.

3. The method as recited in claim 2, wherein the residual zeroth order frequency offset is estimated based at least in part on a phase ratio between the undistorted first and second images.

4. The method as recited in claim 1, wherein step (c) includes:
   computing undistorted phase maps from the reference multi-echo data;
   generating distorted reference data by modulating the reference multi-echo data using the undistorted phase maps; and
   computing the distorted phase maps from the distorted reference data.

5. The method as recited in claim 1, wherein step (c) includes correcting the distorted phase maps for echo asymmetries by computing a phase offset based on the reference multi-echo data and applying the phase offset to the distorted phase maps to correct for echo asymmetries.

6. The method as recited in claim 5, wherein the phase offset is computed based on a ratio between a phase of a first reference image reconstructed from reference multi-echo data acquired at a first echo time and a phase of a second reference image reconstructed from reference multi-echo data acquired at a second echo time in the multi-echo EPI pulse sequence.

7. The method as recited in claim 1, wherein step (c) includes scaling the distorted phase maps by a ratio between a gyromagnetic ratio of the first nuclear spin species and a gyromagnetic ratio of the second nuclear spin species.

8. The method as recited in claim 1, wherein step (c) includes resampling the distorted phase maps to a field-of-view associated with the multi-echo data.

9. The method as recited in claim 1, wherein the second nuclear spin species is hydrogen-1.

10. The method as recited in claim 9, wherein the first nuclear spin species is hyperpolarized carbon-13.

11. The method as recited in claim 9, wherein the first nuclear spin species is hydrogen-1.

12. The method as recited in claim 1, wherein the multi-echo data are time-resolved data and step (d) includes:
   producing first summed data by temporally summing the time-resolved data acquired at the first echo time;
   producing second summed data by temporally summing the time-resolved data acquired at the second echo time;
   reconstructing the first image from the first summed data; and reconstructing the second image from the second summed data.

13. The method as recited in claim 12, wherein the first summed data and the second summed data are apodized before reconstructing the first image and the second image.

14. The method as recited in claim 1, wherein the reference multi-echo data are acquired using a fully phase encoded acquisition.

15. A method for producing distortion-free images using a magnetic resonance imaging (MRI) system operating a dual-echo echo-planar imaging (EPI) pulse sequence, the steps of the method comprising:
   (a) acquiring data from a subject using a dual-echo EPI pulse sequence that acquires data by sampling magnetic resonance signals from a nuclear spin species at a first echo time and a second echo time;
   (b) reconstructing a first image from data acquired at the first echo time and a second image from data acquired at the second echo time;
   (c) computing an initial field map based on a complex division of the first image and the second image;
   (d) producing an updated field map by updating the initial field map using a polynomial fitting;
   (e) providing an echo asymmetry correction map that accounts for echo asymmetries from the dual-echo EPI pulse sequence;
   (f) producing a corrected field map by correcting the updated field map using the provided echo asymmetry correction map;
   (g) converting the corrected field map to a pixel shift map; and
   (h) producing distortion free images by reconstructing images from the acquired data and correcting the reconstructed images using the pixel shift map to remove distortions therein.

16. The method as recited in claim 15, wherein providing the echo asymmetry map includes providing reference data acquired using the dual-echo EPI pulse sequence to sample magnetic resonance signals from a proton spin species at the first echo time and the second echo time, and computing the echo asymmetry map from the provided reference data.

17. The method as recited in claim 16, wherein computing the echo asymmetry map includes:
reconstructing odd echo images from reference data acquired at the first echo time and even echo images from data acquired at the second echo time;
computing a phase difference between two even echo images and one even echo image and an odd echo image; and
fitting the phase difference using a polynomial fitting.

18. The method as recited in claim 16, wherein the echo asymmetry map is scaled by a ratio between a gyromagnetic ratio of the nuclear spin species and a gyromagnetic ratio of the proton spin species.

19. The method as recited in claim 18, wherein the nuclear spin species is hyperpolarized carbon-13.

20. The method as recited in claim 15, wherein the echo asymmetry map is resampled to a field-of-view associated with the data acquired in step (a).

\* \* \* \* \*